United States Patent [19]
Eastmond

[11] Patent Number: 4,606,075
[45] Date of Patent: Aug. 12, 1986

[54] AUTOMATIC GAIN CONTROL RESPONSIVE TO COHERENT AND INCOHERENT SIGNALS

[75] Inventor: Bruce C. Eastmond, Downers Grove, Ill.

[73] Assignee: Motorola, Inc., Schaumburg, Ill.

[21] Appl. No.: 814,518

[22] Filed: Dec. 18, 1985

Related U.S. Application Data

[63] Continuation of Ser. No. 534,512, Sep. 21, 1983, abandoned.

[51] Int. Cl.$^4$ .............................................. H04B 1/16
[52] U.S. Cl. ..................................... 455/234; 455/161; 455/250; 455/260; 455/265
[58] Field of Search ............... 455/161, 169, 200, 234, 455/239, 246, 247, 250, 219, 260, 265; 375/98, 120; 329/50, 124

[56] References Cited

U.S. PATENT DOCUMENTS

| | | |
|---|---|---|
| 3,100,871 | 8/1963 | Richardson et al. . |
| 3,348,152 | 10/1967 | Laughlin, Jr. et al. . |
| 3,358,234 | 12/1967 | Stover . |
| 4,048,566 | 9/1977 | Carson et al. ......................... 455/265 |
| 4,213,096 | 7/1980 | Daniel, Jr. ............................ 455/260 |
| 4,241,454 | 12/1980 | Snell et al. . |
| 4,346,477 | 8/1982 | Gordy . |
| 4,377,728 | 3/1983 | Hilbert . |
| 4,479,253 | 10/1984 | Daniel, Jr. ............................ 455/265 |

OTHER PUBLICATIONS

Phaselock Techniques, by Floyd M. Gardner, Sec. 8.2, p. 157.
The Potential of SSB for Land Mobile Radio, 29th IEEE Vehicular Technology Conference, Mar. 1979, p. 90.

*Primary Examiner*—Jin F. Ng
*Attorney, Agent, or Firm*—F. John Motsinger; Edward M. Roney; James W. Gillman

[57] ABSTRACT

Disclosed, herein, is an Automatic Gain Control (AGC) signal processor and a method for generating an AGC signal in a phase-locked receiver. An incoming signal, exhibiting both coherent and incoherent characteristics, is filtered to obtain the desired bandwidth. The filtered signals are amplified to maintain an amplitude relationship between the coherent and incoherent signals. The incoherent signals are conditioned in the same circuit, but in a different manner, than coherent signals are conditioned. The conditioned signals are utilized to generate an AGC signal such that an AGC signal is generated in a single circuit for both coherent and incoherent signals, although by differing circuit responses, depending upon the conditioning of the incoming signal.

The preferred embodiment of the novel AGC processing contemplates a full wave rectifier as its signal conditioner. Another embodiment contemplates negative peak detection as its conditioner. However, in either embodiment, AGC is generated in a single circuit not only for coherent signals but also for incoherent signals, although generated by differing circuit responses.

16 Claims, 5 Drawing Figures

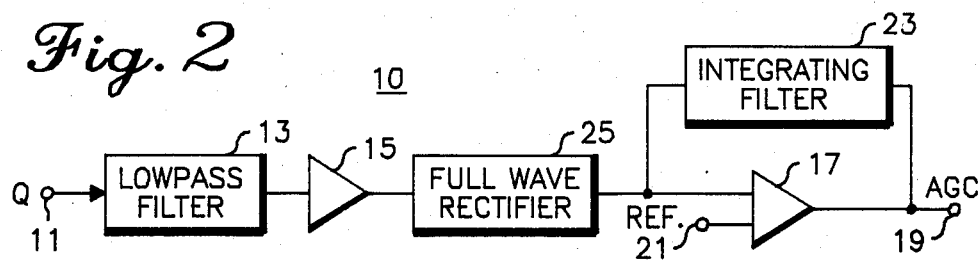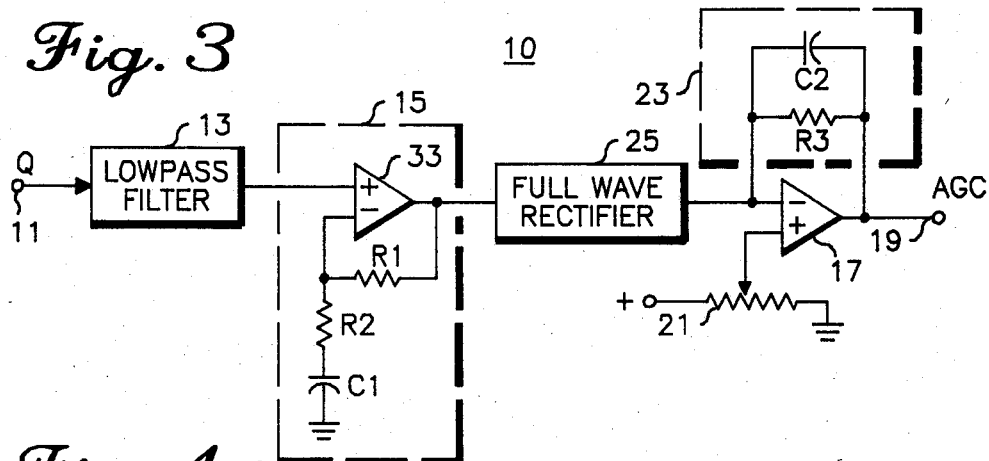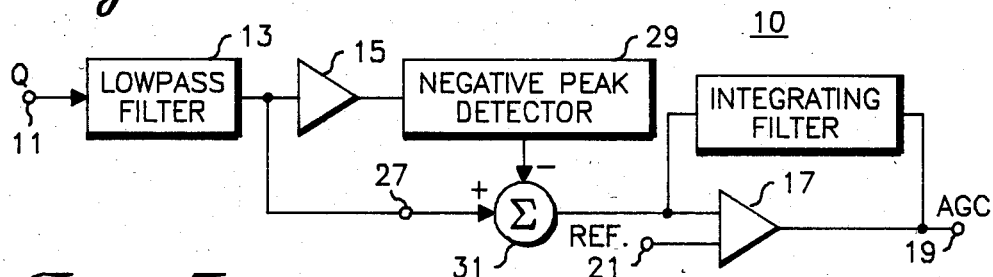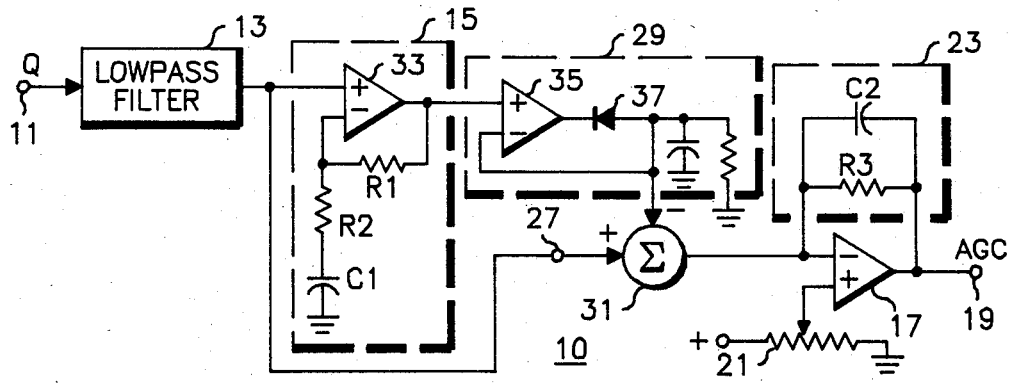

AUTOMATIC GAIN CONTROL RESPONSIVE TO COHERENT AND INCOHERENT SIGNALS

This is a continuation of application Ser. No. 534,512, filed 9-21-83, now abandoned.

FIELD OF THE INVENTION

The disclosed invention, herein, is concerned with Automatic Gain Control (AGC) of incoherent signals, as well as coherent signals, in a phase-locked receiver. More particularly, the disclosed invention not only generates AGC for coherent signals, but also generates, in the same circuit, AGC for incoherent signals, although generated by differing circuit responses.

BACKGROUND OF THE INVENTION

A phase-locked receiver may receive two types of signals—those that are phase coherent and those that are phase incoherent. It is necessary to maintain phase coherency between the carrier of the encoded signal and the receiver's internal reference signal. A phase-locked loop is commonly employed to maintain that coherency. To maintain phase coherency, one phase-lock detector generates a control signal that is proportional to the phase difference between the received signal and the radio's internal reference signal. This phase error signal is used to maintain internal coherency with the received signal.

Another phase lock detector can serve as an indicator of the degree of coherency, and therefore the intelligibility, of the received signal. This detector has been commonly used as a Coherent Automatic Gain Control (AGC) Signal. It is called Coherent Gain Control because it is only generated when the received signal is phase coherent with the radio's internal reference signal. But, this type of gain control has several problems associated with it. Because an AGC voltage is not generated for incoherent signals, various receiver stages may become overloaded by uncontrolled incoherent signals. Further, the lack of incoherent signal gain control allows noise bursts of uncontrolled amplitude to propagate through the receiver stages during intermittent fading of the coherent signals.

Conventionally, incoherent signals are controlled by a separate AGC circuit that detects the signal envelope output by the IF amplifier. Gain control is exercised by the stronger of the response of the coherent circuit or the response of the incoherent circuit. However, the presence of IF envelope modulation may preclude the proper use of this dual AGC system.

To alleviate these problems, the present invention provides a single AGC circuit responsive to coherent signals as well as incoherent signals.

SUMMARY OF THE INVENTION

It is the object of the present invention to provide a single AGC circuit for coherent as well as incoherent signals. It is a further object of the present invention to provide AGC for incoherent signals to avoid overload of receiver stages. These and other objects are accomplished by the present invention.

In accordance with the present invention there is provided an Automatic Gain Control (AGC) signal processor and a method for generating an AGC signal in a phase-locked receiver. An incoming signal, exhibiting either coherent or incoherent characteristics, or both, is filtered to obtain the desired bandwidth. The filtered signal is amplified to maintain a desired amplitude relationship between the coherent and incoherent signals. The incoherent signals are conditioned differently than the coherent signals are conditioned. The conditioned signals are utilized to generate an AGC signal such that an AGC signal is generated in a single circuit for both coherent and incoherent signals by differing circuit responses, depending upon the conditioning of the incoming signal.

The preferred embodiment of the novel AGC processor contemplates a full wave rectifier as its conditioner. Another embodiment contemplates negative peak detection as its conditioner. However, in either embodiment, AGC is generated in a single circuit not only for coherent signals but also for incoherent signals, although generated by a differing circuit response.

The invention will be more clearly understood from the following description when read in connection with the accompanying drawings.

BRIEF DESCRIPTION OF THE DRAWINGS

FIG. 2 shows a block diagram of the preferred embodiment of the present invention.

FIG. 3 shows more specific details of the preferred embodiment.

FIG. 4 shows a block diagram of an alternate embodiment of the present invention.

FIG. 5 shows more specific details of the alternate embodiment.

DESCRIPTION OF THE PREFERRED EMBODIMENT

Figure 1:
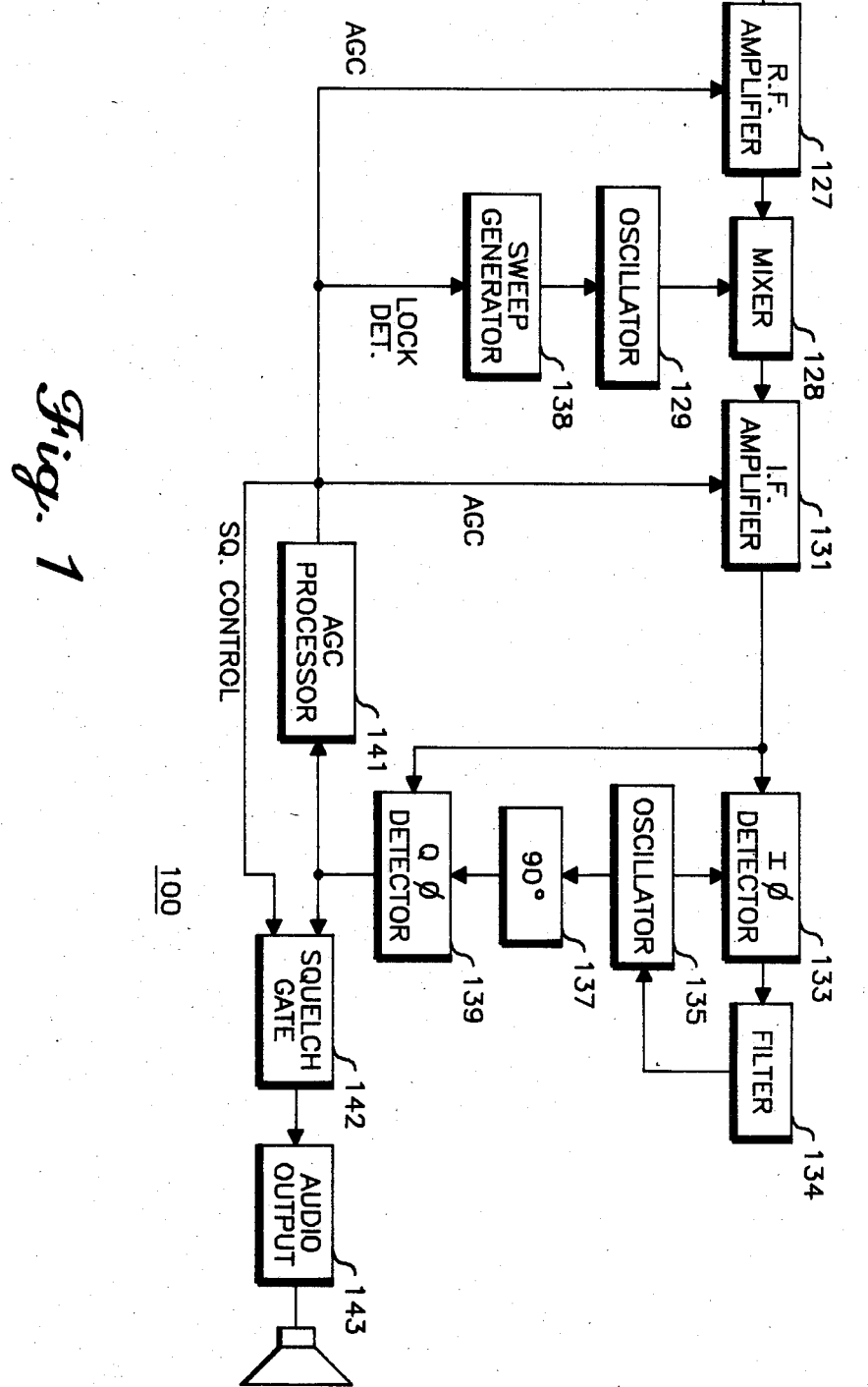
FIG. 1 shows a block diagram of a phase-locked receiver in which the present invention may be utilized.

FIG. 1 illustrates a phase-locked receiver, generally designated 100, with coherent Automatic Gain Control (AGC).

Received signals are amplified by a gain controlled RF amplifier 127. The received signal is translated to an IF frequency by mixing (128) it with a local oscillator frequency 129. The intermediate frequency is amplified by a gain controlled IF amplifier 131. The sweep generator 138 locates the desired frequency by adjusting the oscillator 129 in response to detected phase errors 139. The phase lock loop 133, 134, and 135 locks onto the desired frequency once it has been located.

The quadrature phase detector 139, which is driven from oscillator 135 through 90° phase shift network 137, generates a DC voltage level that is proportional to the cosine of the phase difference between the incoming signal and the lock frequency 135.

When the incoming signal and the lock frequency 135 are not phase coherent, the phase difference varies as a uniformly distributed random variable such that the average cosine of the phase difference is centered about zero volts. Because no DC voltage is generated, the gains of the RF and IF amplifiers become uncontrolled.

However, when the two signals are phase coherent, the phase difference is nearly zero, the cosine approaches unity, and a relatively stable DC voltage is generated. Further, the value of this DC voltage is proportional to the amplitude of the received signal. This DC signal is filtered (141) to remove undesirable AC components. This filtering helps insure stability of the AGC circuit. This filtered DC signal is used to automatically gain control the RF 127 and IF 131 amplifier stages. It can also be used as an indicator of phase lock to disable the sweep generator 138 once the desired frequency has been located. When the receiver loses lock, it can be used to enable the sweep generator 138 to search for the desired signal again. Similarly, it can be used to activate the squelch gate 142 that precedes the audio stages 143 until after lock has been achieved.

FIGS. 2 through 5 illustrate an Automatic Gain Control (AGC) signal processor, generally designated 10, which incorporates various embodiments of the present invention.

Incoming signals are accepted at the input terminal 11 of the AGC signal processor from a quadrature phase detector 139. An AGC signal is generated at the output terminal 19. These circuits are utilized in place of conventional filters described above, shown as block 141 shown in FIG. 1.

The accepted signal 11 is filtered by a low pass filter 13 to obtain the desired bandwidth and to reject signal modulation. This filter replaces the conventional bandpass filter located after IF amplifier 131.

The quadrature signal of appropriate bandwidth is conditioned by selectively amplifying (15) the signal. Capacitor C1 insures that relatively high frequency, incoherent signals are amplified while relatively low frequency, coherent signals are are passed relatively unamplified. Capacitor C1 acts as if it were a short for relatively high frequency, incoherent signals, therey amplifying them by a gain factor of 1+ (R1/R2), yet capacitor C1 acts as if it were an open circuit for relatively low frequency, coherent signals, causing these coherent signals to be passed relatively unamplified.

It is this selective amplification, then, that maintains the relative amplitude of the coherent and incoherent signals. Maintaining the relative amplitudes of the coherent and incoherent signals is the feature that helps keep the various stages from becoming overloaded by uncontrolled, incoherent signals. If the relative amplitude of the coherent and incoherent signals are maintained by other means, this amplifying network 15 could be deleted.

The selectively amplified signal may be further conditioned in at least two ways.

In the preferred embodiment shown in FIGS. 2 and 3, the selectively amplified signal is full wave rectified 25. However, for the most part, only incoherent signals are rectified. This is the case because a rectifier only rectifies and inverts the polarity of negative-going wave peaks. Only the incoherent signals have negative-going peaks because coherent signals are offset from the zero voltage axis by a stable DC offset value. Recall, that when coherent signals are received, the quadrature detector 139 generates a DC value proportional to the cosine of the phase difference between the received signal and the oscillator lock frequency 135. Since the signals are coherent (i.e., negligible phase difference), the quadrature detector generates a relatively stable DC offset value. Further, this DC value is proportional to the strength or amplitude of the incoming signal. Thus, it is because coherent signals are offset by this stable DC voltage that coherent signals are seldom rectified. Only excessive amplitude peaks exceeding the DC offset voltage would be rectified.

On the other hand, when incoherent signals are received, the uniformly distributed random phase differences become large and the cosine becomes small. Therefore, since the DC level shift is proportional to the cosine, the DC level shift becomes negligible and the incoherent signal is centered about the zero voltage axis. Accordingly, coherent signals are rarely rectified, whereas incoherent signals are nearly fully rectified. Once fully rectified, there is an average DC level proportional to the amplitude of the incoming signal. This average DC level generated by the rectifier provides the AGC sought for incoherent signal control.

In the alternate embodiment shown in FIGS. 4 and 5, the signals 11 are conditioned by negative peak detection 29 rather than by full wave rectification 25. However, the objective is still the same. The objective is to generate a DC value for both coherent and incoherent signals.

In the alternate embodiment of FIGS. 4 and 5, a DC level is generated from the difference 31 of the DC level shift produced by coherent signals 27 and the negative peak 29 values produced by incoherent signals. Coherent DC level shifts are received from the quadrature phase detector 139 as discussed above. However, in this embodiment, a DC level is generated for incoherent signals by detecting the negative-going peaks 29 in the incoherent signals. An AGC signal is generated in response to the difference 31 of the DC components of the coherent and incoherent signals.

In operation, during strong coherent signal receipt, the coherent DC level shift 27, passed from the quadrature detector, will dominate. Contrastingly, during strong incoherent signal receipt, the DC value of the negative peak detection 29 circuit will dominate.

This negative peak detection is merely an alternate way of conditioning the incoherent signal differently from coherent signals.

Returning now to a general discussion of both embodiments, shown in FIGS. 1–4, and having gotten a DC level for both coherent and incoherent signals, the current AGC signal 19 may be instaneously updated by comparing 17 the most recent value with a reference signal 21. Any one of a number of standard comparing techniques may be utilized.

Here, after the signals have been conditioned to generate a DC level by either the rectification method or the negative peak detection method, the level is compared in difference amplifier 17 against a previous or current level, schematically represented by reference signal 21. The instantaneous difference of the levels is used to adjust the AGC signal 19 to a new value.

The integrating filter 23 serves to smooth the AGC adjustments, to provide stability and avoid spurious oscillations. It has been determined that the best results are obtained if element values are chosen such that $1/(2 \times pi \times R_3 C_2)$ is less than $1/(2 \times pi \times R_1 C_1)$, and such that both expressions are much less than the low pass filter 13 cutoff frequency.

Thus, there has been provided a method for processing an AGC signal and an AGC signal processor that generates an AGC signal in a single circuit not only in response to coherent signals but also in response to incoherent signals. Further, AGC has been provided for incoherent signals to avoid overload of receiver stages. The AGC works down to noise to avoid objectionable noise bursts propagated throughout the receiver stages during fades of coherent signals. It provides a pilot-carrier SSB receiver which produces a quiet audio output during speech pauses by not deriving AGC from the IF envelope. Yet another benefit is acheived by maintaining constant bandwidth in the phase-locked loop. Moreover, the present invention is less costly than dual AGC, conventionally employed.

The foregoing descriptions of the various embodiments are illustrative of the broad inventive concept comprehended by the invention and has been given for clarity of understanding. However, it is not intended to cover all changes and modifications which do constitute departures from the scope and spirit of the invention.

I claim:

1. A method of generating an Automatic Gain Control (AGC) signal in a phase-locked receiver from a quadrature signal that is of appropriate bandwidth and that contains phase components that are both phase-coherent and phase-incoherent with the quadrature signal comprising the steps of:
selectively amplifying the quadrature signal such that relatively high frequency, phase-incoherent signals are amplified while relatively low frequency, phase-coherent signals are relatively unamplified;
detecting the selectively amplified signal; and
generating an AGC signal that is, at least, a function of the difference between the detected selectively amplified signal and a reference signal,
whereby the AGC signal is generated for both phase-coherent and phase-incoherent signals and whereby the relative amplitude of the phase-coherent and phase-incoherent signals may be maintained.

2. A method as claimed in claim 1 wherein the bandwidth is realized by filtering the quadrature signal to obtain the appropriate bandwidth.

3. A method as claimed in claim 1 wherein the AGC signal generating step comprises the step of:
generating a D.C. signal which is at least a function of the difference between a reference D.C. signal and the D.C. signal of the detected selectively amplified signal.

4. A method as claimed in claim 1 wherein the AGC signal generating step comprises the step of:
generating an AGC signal which is a function of the difference between a reference signal and the combination of a fedback AGC signal and the detected selectively amplified signal.

5. A method as claimed in claim 4 wherein the AGC signal generating step further comprises the step of:
filtering the fedback AGC signal.

6. A method as claimed in claim 1 wherein the detecting step comprises the step of:
full wave rectifying the phase incoherent signals to produce an average rectified signal while permitting the phase coherent signals to pass relatively unaffected,
whereby phase coherent signals are characterized by a relatively fixed offset signal due to their phase relationship and are passed relatively unrectified whereas phase incoherent signals are fully rectified to produce a relatively stable average signal.

7. A method as claimed in claim 6 wherein the signal generating step comprises the step of:
generating an AGC signal which is at least a function of the difference between a reference signal and either the relatively fixed offset signal or the relatively stable average signal.

8. A method as claimed in claim 1 wherein the detecting step comprises the steps of:
detecting negative peaks in the phase incoherent quadrature signals, and
summing the difference between the quadrature signal and the negatively detected peaks,
whereby phase coherent signals are characterized by a relatively fixed offset signal due to their phase relationship and are passed relatively undetected whereas phase incoherent signals are detected as a relatively stable negative peak signal and such that the relatively fixed offset signal and the relatively stable negative peak signal are summed for their difference.

9. A method as claimed in claim 8 wherein the signal generating step comprises the step of:
generating an AGC signal which is at least a function of the difference between the reference signal and either the relatively fixed offset signal or the relatively stable negative peak signal.

10. An Automatic Gain Control (AGC) signal processor in a phase-locked receiver for producing AGC from a quadrature signal that is of appropriate bandwidth and that contains phase components that are both phase-coherent and phase-incoherent with the quadrature signal comprising:
means, having an input and an output, for selectively amplifying the quadrature signal such that relatively high frequency, phase-incoherent signals are amplified while relatively low frequency, phase-coherent signals are relatively unamplified;
means, having an input coupled to the selective amplification means output and having an output, for detecting the selectively amplified signal; and
means, having an input coupled to the detected selective amplification means output and having an output, for generating an AGC signal that is, at least, a function of the difference between the selectively amplified signal and a reference signal,
whereby the AGC signal is generated for both phase-coherent and phase-incoherent signals and whereby the relative amplitude of the phase-coherent and phase-incoherent signals may be maintained.

11. A processor as claimed in claim 10 wherein the processor further comprises:
filter means, coupled to the selective amplification means input for filtering the quadrature signal to obtain the appropriate bandwidth.

12. A processor as claimed in claim 10 wherein the signal generation means comprises:
a difference amplifier.

13. A processor as claimed in claim 10 wherein the AGC signal generation means comprises:
an integrating difference amplifier.

14. A processor as claimed in claim 10 wherein the AGC signal generation means comprises:
a low pass filtered difference amplifier.

15. A method of generating an Automatic Gain Control (AGC) signal in a phase-locked receiver from a quadrature signal that is of appropriate bandwidth and that contains phase components that are both phase-coherent and phase-incoherent with the quadrature signal comprising the steps of:
full wave rectifying the phase-incoherent signals to produce an average rectified signal while permitting the phase-coherent signals to pass relatively unrectified;
generating an AGC signal that is, at least, a function of the difference between the rectified signal and a reference signal,
whereby the AGC signal is generated for both phase-coherent and phase-incoherent signals and whereby, phase-coherent signals are characterized by a relatively fixed offset signal due to their phase relationship and are passed relatively unrectified whereas phase-incoherent signals are fully rectified to produce a relatively stable average signal.

16. A method of generating an Automatic Gain Control (AGC) signal in a phase-locked receiver from a quadrature signal that is of appropriate bandwidth and that contains phase components that are both phase-coherent and phase-incoherent with the quadrature signal comprising the steps of:

detecting negative peaks in the phase-incoherent quadrature signals;

summing the difference between the quadrature signal and the negatively peak detected signals;

generating an AGC signal that is, at least, a function of the difference between the summed, negatively peak detected signal and a reference signal, whereby the AGC signal is generated for both coherent and incoherent signals and whereby phase-coherent signals are characterized by a relatively fixed offset signal due to their phase relationship and are passed relatively undetected whereas phase-incoherent signals are detected as a relatively stable negative peak signal and such that the relatively fixed offset signal and the relatively stable negative peak signal are summed for their difference.

* * * * *